(12) United States Patent
Kawamura et al.

(10) Patent No.: US 8,377,742 B2
(45) Date of Patent: Feb. 19, 2013

(54) THIN FILM TRANSISTOR AND METHOD FOR MANUFACTURING THE SAME

(75) Inventors: Tetsufumi Kawamura, Kodaira (JP); Hiroyuki Uchiyama, Musashimurayama (JP); Hironori Wakana, Tokorozawa (JP); Mutsuko Hatano, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 304 days.

(21) Appl. No.: 12/843,977

(22) Filed: Jul. 27, 2010

(65) Prior Publication Data

US 2011/0049508 A1 Mar. 3, 2011

(30) Foreign Application Priority Data

Sep. 3, 2009 (JP) ................................. 2009-203274

(51) Int. Cl.
*H01L 21/16* (2006.01)

(52) U.S. Cl. ..... 438/104; 438/158; 257/43; 257/E29.94; 257/E29.288; 257/E29.296

(58) Field of Classification Search .................. 438/104, 438/158; 257/43
See application file for complete search history.

(56) References Cited

U.S. PATENT DOCUMENTS

| | | | | |
|---|---|---|---|---|
| 6,623,653 | B2 * | 9/2003 | Furuta et al. | 216/24 |
| 2009/0142867 | A1 * | 6/2009 | Fujikawa et al. | 438/30 |
| 2009/0278120 | A1 * | 11/2009 | Lee et al. | 257/43 |
| 2009/0278211 | A1 * | 11/2009 | Kim et al. | 257/411 |
| 2010/0105163 | A1 * | 4/2010 | Ito et al. | 438/104 |
| 2010/0155718 | A1 * | 6/2010 | Kirita et al. | 257/43 |
| 2011/0159646 | A1 * | 6/2011 | Ryu et al. | 438/156 |
| 2011/0263079 | A1 * | 10/2011 | Wang | 438/149 |

FOREIGN PATENT DOCUMENTS

JP 2010-021170 A 1/2010

OTHER PUBLICATIONS

Sun Il Kim, "High Reliable and Manufacturable Gallium Indium Zinc Oxide Thin-Film Transistors Using the Double Layers as an Active Layer", Journal of the Electrochemical Society, 156(3) H184-H187 (2009).

Chang-Jung Kim "Characteristics and Cleaning of Dry-Etching-Damaged Layer of Amorphous Oxide Thin-Film Transistor", Electrochemical and Solid-State Letters, 12 (4) H95-H97, 2009.

\* cited by examiner

*Primary Examiner* — A. Sefer (74) *Attorney, Agent, or Firm* — Miles and Stockbridge P.C.

(57) ABSTRACT

In a manufacturing method for thin film transistors, the following procedure is taken: a sacrifice layer comprised of a metal oxide semiconductor is formed over a conductive layer comprised of a metal oxide semiconductor; a metal film is formed over the sacrifice layer; the metal film is processed by dry etching; and the portion of the sacrifice layer exposed by this dry etching is subjected to wet etching.

15 Claims, 7 Drawing Sheets

THIN FILM TRANSISTOR AND METHOD FOR MANUFACTURING THE SAME

CLAIM OF PRIORITY

The present application claims priority from Japanese patent application JP 2009-203274 filed on Sep. 3, 2009, the content of which is hereby incorporated by reference into this application.

FIELD OF THE INVENTION

The present invention relates to semiconductor devices and in particular to a semiconductor device including a field effect transistor using a metal oxide film for a channel layer.

BACKGROUND OF THE INVENTION

Thin film transistors (hereafter, simply referred to as TFT sometimes in this specification) are devices that can be formed over an insulator substrate of glass or the like and undertake an important role in electronic technology. Amorphous silicon or polycrystalline silicon is presently most widely used as a channel layer material of TFTs. In recent years, however, metal oxide semiconductors have come under the spotlight as a channel layer material of TFTs in an attempt to replace these silicon materials. In addition to its excellent characteristics for channel layers, the metal oxide semiconductor is characterized in that it can be formed at near room temperature. For this reason, it is considered as one of major candidates of a channel layer material when TFT is formed over a so-called flexible substrate such as a plastic film.

However, the oxide semiconductor has a disadvantage. When exposed to plasma or accelerated particles, it is damaged (oxygen defect) and is reduced in resistance and may be turned conductive sometimes. For this reason, it is required to deal with the two challenges described below to form a top-contact TFT with the same structure as that of amorphous silicon TFTs presently in wide use in industry. First, it is required to eliminate damage an oxide semiconductor suffers when a metal film is formed over the oxide semiconductor by a method, such as sputtering, involving the production of plasma or accelerated particles. Second, it is required to eliminate damage an oxide semiconductor suffers when dry etching is adopted to process a metal film to form a source/drain electrode. The formation of a metal film by sputtering is high in mass productivity and is in wide use in industry because of excellence in resulting film quality, film formation speed, uniformity, and yield. The dry etching process is also excellent in processing accuracy and processing speed and is high in mass productivity and in wide use in industry.

Methods for dealing with the above two challenges are reported in Non-patent Documents 1 (Electrochemical and Solid-State Letters, 12 (4) H95-H97 (2009)) and 2 (Journal of The Electrochemical Society, 156 (3) H184-H187 (2009)). In the method in Non-patent Document 1, a region 30 nm or so in thickness, damaged by dry etching, in an In—Ga—Zn—O channel layer is removed by wet etching. In the method in Non-patent Document 2, an etch stopper layer is formed of Cu—In—Ga—Zn—O (high-resistance semiconductor) over an In—Ga—Zn—O channel layer to absorb damage caused during dry etching of a source/drain electrode.

SUMMARY OF THE INVENTION

In the method described in Non-patent Document 1, as mentioned above, a region damaged by dry etching is removed by wet etching. However, this method involves a problem. The thickness of a channel layer is determined by wet etching that is inferior in controllability. When a large number of TFTs are formed in a large area, therefore, variation is produced in the thickness of channel layers and this increases variation in TFT characteristics and reduces a production yield.

In the method described in Non-patent Document 2, damage caused during dry etching of a source/drain electrode is absorbed by Cu—In—Ga—Zn—O. In this method, a Cu—In—Ga—Zn—O layer high in resistance is placed between an In—Ga—Zn—O channel layer and a source/drain electrode and a problem of the reduced on current of TFT arises.

This invention has been made in consideration of the foregoing and an object thereof is as follows: when a top-contact TFT is formed using dry etching to process a source/drain electrode, increase in variation in TFT characteristics, reduction in yield, and reduction in TFT on current are suppressed.

The following is a brief description of the gist of the representative elements of the invention laid open in this application:

In a manufacturing method for a thin film transistor, the following procedure is taken: a sacrifice layer comprised of a metal oxide semiconductor is formed over a conductive layer comprised of a metal oxide semiconductor; a metal film is formed over the sacrifice layer; the metal film is processed by dry etching; and the sacrifice layer exposed by this dry etching is subjected to wet etching.

The following is a brief description of the gist of an effect obtained by the representative elements of the invention laid open in this application: when a top-contact TFT is formed using dry etching to process a source/drain electrode, increase in variation in TFT characteristics and reduction in the on current of TFT can be suppressed.

DETAILED DESCRIPTION OF THE PREFERRED EMBODIMENTS

First Embodiment

FIGS. 1A to 1D illustrate the configuration of and a manufacturing method for a semiconductor device in the first embodiment. A so-called bottom-gate/top-contact oxide TFT is taken as an example of the semiconductor device. The bottom-gate cited here refers to a structure in which a gate electrode GE is formed in a layer lower than a semiconductor layer SCL. The top-contact refers to a structure in which a source electrode SE and a drain electrode DE are formed in a layer higher than the semiconductor layer SCL.

Figure 1A:
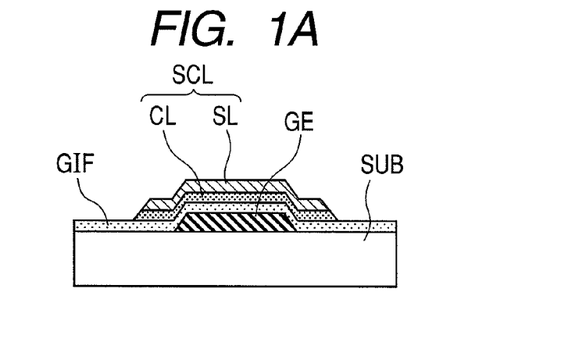
FIG. 1A is a sectional view illustrating the configuration of and a manufacturing method for a semiconductor device in a first embodiment of the invention.

The manufacturing method for the semiconductor device in the first embodiment is as described below. As illustrated in FIG. 1A, first, a gate electrode GE, a gate insulating film GIF, a conductive layer CL, and a sacrifice layer SL are formed over an insulator substrate SUB.

The substrate SUB is formed of, for example, glass, quartz, a plastic film, or the like and its surface on the side where the gate electrode GE is formed is coated with an insulating film as required.

The gate electrode GE is formed of a conductive material. Examples of such a material include: a single film of molybdenum, chromium, tungsten, aluminum, copper, titanium, nickel, tantalum, silver, zinc, or any other metal, an alloy film of them, or a laminated film of them; a metal oxide conductive film of ITO (In—Sn—O: indium-tin oxide) or the like or a laminated film of them and metal; a metal nitride conductive film of titanium nitride (Ti—N) or the like or a laminated film of them and metal; any other conductive metal compound film or a laminated film of them and metal; a semiconductor containing a high concentration of carriers; or a laminated film of a semiconductor and metal. The film is formed by CVD, sputtering, or the like and is processed by a combination of a common photolithography technology and dry etching or wet etching.

It is desirable that an oxide insulating film of Si—O, Al—O, or the like should be used for the gate insulating film GIF. However, an inorganic insulating film of Si—N or the like other than oxide or an organic insulating film of parylene or the like may be used. The gate insulating film GIF is formed by CVD, sputtering, a method of application, or the like.

The conductive layer CL and the sacrifice layer SL are formed of oxide of Zn, In, Ga, or Sn, such as Zn—O, In—O, Ga—O, Sn—O, In—Ga—Zn—O, Zn—Sn—O, In—Sn—O, In—Zn—O, Ga—Zn—O, In—Ga—O, or Al—Zn—O, or composite oxide of them. They are formed by sputtering, PLD, CVD, a method of application, a print process, or the like. It is desirable that the thickness of the conductive layer CL should be 5 nm or above and the thickness of the sacrifice layer SL should be 30 nm or above. Processing for forming an island structure for element isolation in the conductive layer CL and the sacrifice layer SL is carried out by a combination of a common photolithography technology and wet etching or dry etching. The conductive layer CL is lower than the sacrifice layer SL in etch rate to wet etching liquid comprised of inorganic acid or organic acid. To produce a difference in etch rate, for example, the following methods are used: the Sn concentration in the conductive layer CL is made higher than that in the sacrifice layer SL; or the denseness (and thus the refraction index) of the conductive layer CL is made higher than that of the sacrifice layer SL.

Various combinations of the above-mentioned materials are possible as a combination of the conductive layer CL and the sacrifice layer SL. Among them, for example, the following combination is desirable: a combination of the conductive layer CL comprised of either of Zn—Sn—O and In—Sn—O and the sacrifice layer SL comprised of any of In—Ga—Zn—O, Zn—O, In—Zn—O, Al—Zn—O, Ga—Zn—O, and Zn—Sn—O.

To make the Sn concentration in the conductive layer CL higher than that in the sacrifice layer SL, the following method is used: the Sn concentration in raw material used when the conductive layer CL is formed is made higher than that in raw material used when the sacrifice layer SL is formed. When both these layers are formed by sputtering or PLD, for example, the Sn concentration in a target for the conductive layer CL is made higher than that in a target for the sacrifice layer SL. Or, Sn targets are simultaneously placed only when the conductive layer CL is formed. To make the denseness of the conductive layer CL, higher than that of the sacrifice layer SL, for example, the film formation rate of the conductive layer CL is made lower than that of the sacrifice layer SL. Or, the film formation temperature of the conductive layer CL is made lower than that of the sacrifice layer SL.

Figure 1B:
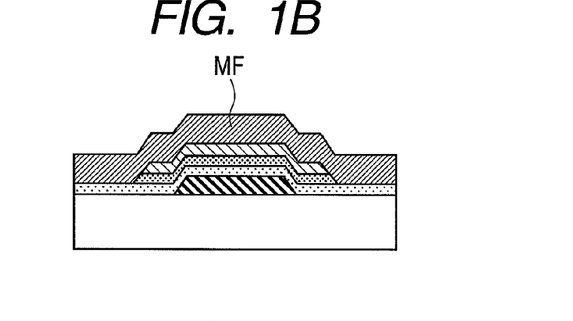
FIG. 1B is a sectional view following FIG. 1A.

Thereafter, as illustrated in FIG. 1B, a metal film MF is formed over the sacrifice layer SL. The metal film MF is formed of, for example, the following: a single film of molybdenum, chromium, tungsten, aluminum, copper, titanium, nickel, tantalum, silver, zinc, or any other metal, an alloy film of them, or a laminated film of them; a metal oxide conductive film of ITO (In—Sn—O: indium-tin oxide) or the like or a laminated film of them and metal; a metal nitride conductive film of titanium nitride (Ti—N) or the like or a laminated film of them and metal; any other conductive metal compound film or a laminated film of them and metal; a semiconductor containing a high concentration of carriers; or a laminated film of a semiconductor and metal.

Figure 1C:
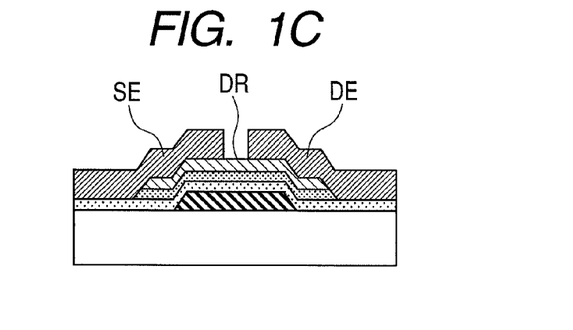
FIG. 1C is a sectional view following FIG. 1B.

Thereafter, as illustrated in FIG. 1C, the metal film MF is processed into the shape of a source electrode SE and a drain electrode DE by a combination of a common photolithography technology and dry etching. At this time the portion of the sacrifice layer SL positioned under an opening between the source electrode SE and the drain electrode DE is exposed to plasma and accelerated particles; therefore, a damage region DR is formed there.

Figure 1D:
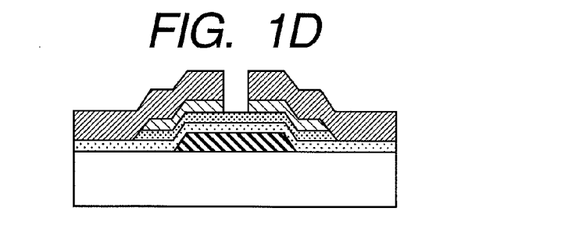
FIG. 1D is a sectional view following FIG. 1C.

Thereafter, as illustrated in FIG. 1D, the damage region DR is removed by wet etching using etchant comprised of inorganic acid or organic acid. At this time, the conductive layer CL is lower in etch rate than the sacrifice layer SL; therefore, wet etching is automatically stopped at the surface of the conductive layer. CL and the thickness of the conductive layer CL is substantially not reduced by wet etching. The reason why wet etching, not dry etching, is used is to avoid damage to the conductive layer CL due to its exposure to plasma or accelerated particles during dry etching.

According to the first embodiment, there is substantially not reduction in the film thickness of the conductive layer CL due to overetch even though the damage region DR is removed by less controllable wet etching. This makes it possible to suppress variation in the thickness of the channel layer (the conductive layer CL in the first embodiment) of TFT. That is, it is possible to suppress increase in variation in TFT characteristics and reduction in the yield of TFT. Further, the dry etch damage absorbing layer (the sacrifice layer SL in the invention) sandwiched between the source electrode SE and the drain electrode DE and the channel layer (conductive layer CL) is not a high-resistance semiconductor such as Cu—In—Ga—Zn—O. Therefore, reduction in the on current of TFT can be suppressed.

Second Embodiment

FIGS. 2A to 2D illustrate the configuration of and a manufacturing method for a semiconductor device in the second embodiment. The second embodiment is different from the first embodiment in that the semiconductor, layer SCL is comprised of three layers and it is identical with the first embodiment in the other respects. In the first embodiment, the etch rate of the conductive layer CL is made lower than that of the sacrifice layer SL. As a result, when the sacrifice layer SL is removed by wet etching, wet etching is automatically stopped at the surface of the conductive layer CL. In the second embodiment, meanwhile, this etch stop function is assigned to an etch stopper layer ESL formed between the conductive layer CL and the sacrifice layer SL. That is, wet etching is automatically stopped at the surface of the etch stopper layer ESL.

Figure 2A:
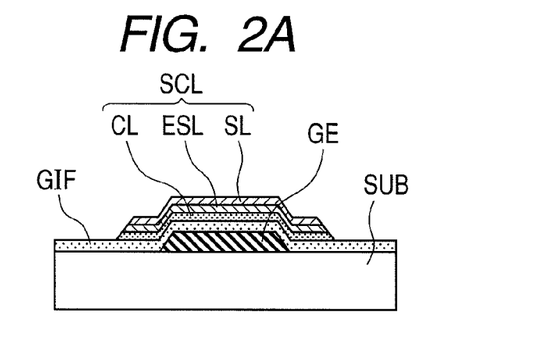
FIG. 2A is a sectional view illustrating the configuration of and a manufacturing method for a semiconductor device in a second embodiment of the invention.
Figure 2B:
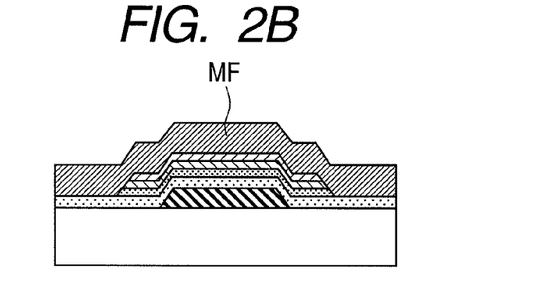
FIG. 2B is a sectional view following FIG. 2A.
Figure 2C:
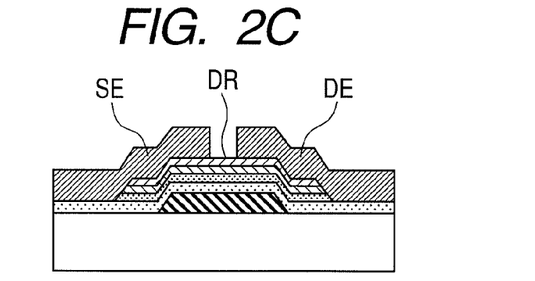
FIG. 2C is a sectional view following FIG. 2B.

The conductive layer CL, etch stopper layer ESL, and sacrifice layer SL are formed of oxide of Zn, In, Ga, or Sn, such as Zn—O, In—O, Ga—O, Sn—O, In—Ga—Zn—O, Zn—Sn—O, In—Sn—O, In—Zn—O, Ga—Zn—O, In—Ga—O, or Al—Zn—O, or composite oxide of them. These films are formed by sputtering, PLD, CVD, a method of application, a print process, or the like. It is desirable that the thickness of the conductive layer CL and the etch stopper layer ESL should be 5 nm or above and the thickness of the sacrifice layer SL should be 30 nm or above. Processing for forming an island structure for element isolation in the conductive layer CL, etch stopper layer ESL, and sacrifice layer SL is carried out by a combination of a common photolithography technology and wet etching or dry etching. The etch stopper layer ESL is lower than the sacrifice layer SL in etch rate to wet etching liquid comprised of inorganic acid or organic acid. To produce a different in etch rate, for example, the following methods are used: the Sn concentration in the etch stopper layer ESL is made higher than that in the sacrifice layer SL; or the denseness (and thus the refraction index) of the etch stopper layer ESL is made higher than that of the sacrifice layer SL.

Various combinations of the above-mentioned materials are possible as a combination of the etch stopper layer ESL and the sacrifice layer SL. Among them, for example, the following combination is desirable: a combination of the etch stopper layer ESL comprised of either of Zn—Sn—O and In—Sn—O and the sacrifice layer SL comprised of any of In—Ga—Zn—O, Zn—O, In—Zn—O, Al—Zn—O, Ga—Zn—O, and Zn—Sn—O.

To make the Sn concentration in the etch stopper layer ESL higher than that in the sacrifice layer SL, the following method is used: the Sn concentration in raw material used when the etch stopper layer ESL is formed is made higher than that in raw material used when the sacrifice layer SL is formed. When both these layers are formed by sputtering or PLD, for example, the Sn concentration in a target for the etch stopper layer. ESL is made higher than that in a target for the sacrifice layer SL. Or, Sn targets are simultaneously placed only when the etch stopper layer ESL is formed. To make the denseness of the etch stopper layer ESL higher than that of the sacrifice layer SL, for example, the film formation rate of the etch stopper layer ESL is made lower than that of the sacrifice layer SL. Or, the film formation temperature of the etch stopper layer ESL is made lower than that of the sacrifice layer SL.

Figure 2D:
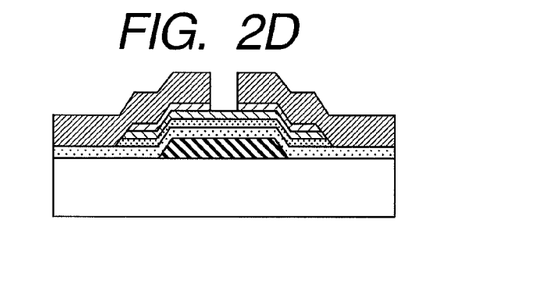
FIG. 2D is a sectional view following FIG. 2C.

According to the second embodiment, similarly with the first embodiment, there is substantially not reduction in the film thickness of the etch stopper layer ESL due to overetch even though the damage region DR is removed by less controllable wet etching. This makes it possible to suppress variation in the thickness of the channel layer (the conductive layer CL+the etch stopper layer ESL in the second embodiment) of TFT. That is, it is possible to suppress increase in variation in TFT characteristics and reduction in the yield of TFT. Further, the dry etch damage absorbing layer (the sacrifice layer SL in the invention) is sandwiched between the source electrode SE and the drain electrode DE and the channel layer (the conductive layer CL+the etch stopper layer ESL). This dry etch damage absorbing layer is not a high-resistance semiconductor such as Cu—In—Ga—Zn—O. Therefore, reduction in the on current of TFT can be suppressed. In addition, it is possible to determine a main part of conducting performance by the conductive layer CL and determine etch stop capability by the etch stopper layer ESL. This makes it possible to independently control the electrical conductivity and processability of a channel of TFT and increases the number of choices of materials used as compared with the first embodiment.

Third Embodiment

FIGS. 3A to 3D illustrate the configuration of and a manufacturing method for a semiconductor device in the third embodiment. A so-called top-gate/top-contact oxide TFT is taken as an example of the semiconductor device. The top-gate cited here refers to a structure in which a gate electrode GE is formed in a layer higher than a semiconductor layer SCL. The top-contact refers to a structure in which a source electrode SE and a drain electrode DE are formed in a layer higher than the semiconductor layer SCL.

Figure 3A:
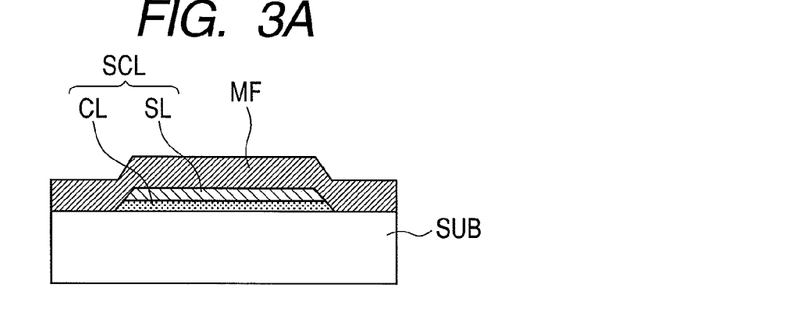
FIG. 3A is a sectional view illustrating the configuration of and a manufacturing method for a semiconductor device in a third embodiment of the invention.

The manufacturing method for the semiconductor device in the third embodiment is as described below. As illustrated in FIG. 3A, first, a conductive layer CL, a sacrifice layer SL, and a metal film MF are formed over an insulator substrate SUB.

The substrate SUB is formed of, for example, glass, quartz, a plastic film, or the like; its surface on the side where a semiconductor layer SCL comprised of the conductive layer CL and the sacrifice layer SL is formed is coated with an insulating film as required.

The conductive layer CL and the sacrifice layer SL are formed of oxide of Zn, In, Ga, or Sn, such as Zn—O, In—O, Ga—O, Sn—O, In—Ga—Zn—O, Zn—Sn—O, In—Sn—O, In—Zn—O, Ga—Zn—O, or Al—Zn—O, or composite oxide of them. They are formed by sputtering, PLD, CVD, a method of application, a print process, or the like. It is desirable that the thickness of the conductive layer CL should be 5 nm or above and the thickness of the sacrifice layer SL should be 30 nm or above. Processing for forming an island structure for element isolation in the conductive layer CL and the sacrifice layer SL is carried out by a combination of a common photolithography technology and wet etching or dry etching. The conductive layer CL is lower than the sacrifice layer SL in etch rate to wet etching liquid comprised of inorganic acid or organic acid. To produce a difference in etch rate, for example, the following methods are used: the Sn concentration in the conductive layer CL is made higher than that in the sacrifice layer SL; or the denseness (and thus the refraction index) of the conductive layer CL is made higher than that of the sacrifice layer SL.

Various combinations of the above-mentioned materials are possible as a combination of the conductive layer CL and the sacrifice layer SL. Among them, for example, the following combination is desirable: a combination of the conductive layer CL comprised of either Zn—Sn—O and In—Sn—O and the sacrifice layer SL comprised of any of In—Ga—Zn—O, Zn—O, In—Zn—O, Al—Zn—O, Ga—Zn—O, and Zn—Sn—O.

To make the Sn concentration in the conductive layer CL higher than that in the sacrifice layer SL, the following method is used: the Sn concentration in raw material used when the conductive layer CL is formed is made higher than that in raw material used when the sacrifice layer SL is formed. When both these layers are formed by sputtering or PLD, for example, the Sn concentration in a target for the conductive layer CL is made higher than that in a target for the sacrifice layer SL. Or, Sn targets are simultaneously placed only when the conductive layer CL is formed. To make the denseness of the conductive layer CL higher than that of the sacrifice layer SL, for example, the film formation rate of the conductive layer CL is made lower than that of the sacrifice layer SL. Or, the film formation temperature of the conductive layer CL is made lower than that of the sacrifice layer SL.

The metal film MF is formed of, for example, the following: a single film of molybdenum, chromium, tungsten, aluminum, copper, titanium, nickel, tantalum, silver, zinc, or any other metal, an alloy film of them, or a laminated film of them; a metal oxide conductive film of ITO (In—Sn—O: indium-tin oxide) or the like or a laminated film of them and metal; a metal nitride conductive film of titanium nitride (Ti—N) or the like or a laminated film of them and metal; any other conductive metal compound film or a laminated film of them and metal; a semiconductor containing a high concentration of carriers; or a laminated film of a semiconductor and metal.

Figure 3B:
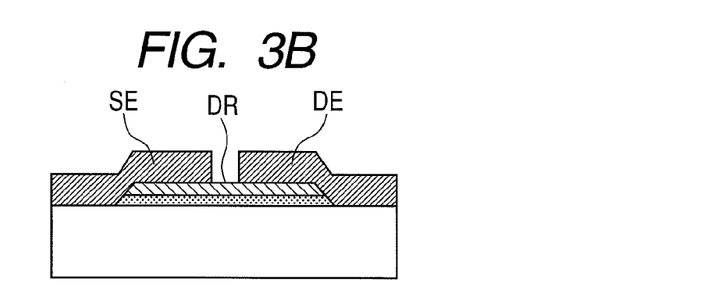
FIG. 3B is a sectional view following FIG. 3A.

Thereafter, as illustrated in FIG. 3B, the metal film MF is processed into the shape of a source electrode SE and a drain electrode DE by a combination of a common photolithography technology and dry etching. As this time, the portion of the sacrifice layer SL positioned under an opening between the source electrode SE and the drain electrode DE is exposed to plasma and accelerated particles; therefore, a damage region DR is formed there.

Figure 3C:
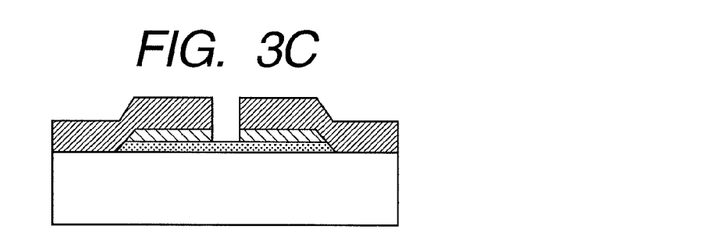
FIG. 3C is a sectional view following FIG. 3B.

Thereafter, as illustrated in FIG. 3C, the damage region DR is removed by wet etching using etchant comprised of inorganic acid or organic acid. At this time, the conductive layer CL is lower in etch rate than the sacrifice layer SL; therefore, wet etching is automatically stopped at the surface of the conductive layer CL and the thickness of the conductive layer CL is substantially not reduced by wet etching. The reason why wet etching, not dry etching, is used is to avoid damage to the conductive layer CL due to its exposure to plasma or accelerated particles during dry etching.

Figure 3D:
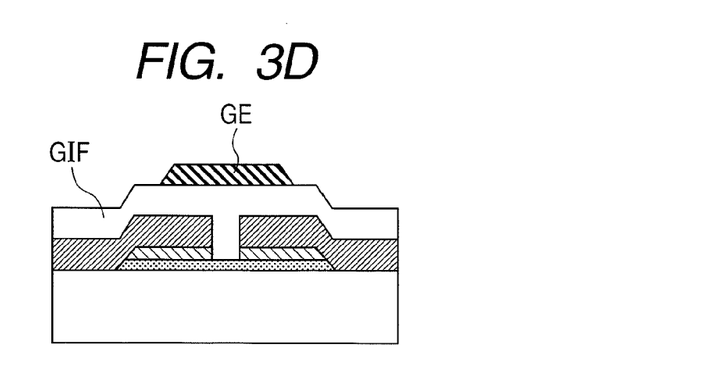
FIG. 3D is a sectional view following FIG. 3C.

Thereafter, as illustrated in FIG. 3D, a gate insulating film GIF is formed so that the semiconductor layer SCL, source electrode SE, and drain electrode DE are covered therewith and a gate electrode GE is formed thereover.

It is desirable that an oxide insulating film of Si—O, Al—O, or the like should be used for the gate insulating film GIF. However, an inorganic insulating film of Si—N or the like other than oxide or an organic insulating film of parylene or the like may be used. The gate insulating film GIF is formed by CVD, sputtering, a method of application, or the like.

The gate electrode GE is formed of a conductive material. Examples of such a material include: a single film of molybdenum, chromium, tungsten, aluminum, copper, titanium, nickel, tantalum, silver, zinc, or any other metal, an alloy film of them, or a laminated film of them; a metal oxide conductive film of ITO (In—Sn—O: indium-tin oxide) or the like or a laminated film of them and metal; a metal nitride conductive film of titanium nitride (Ti—N) or the like or a laminated film of them and metal; any other conductive metal compound film or a laminated film of them and metal; a semiconductor containing a high concentration of carriers; or a laminated film of a semiconductor and metal. The film is formed by CVD, sputtering, or the like and is processed by a combination of a common photolithography technology and dry etching or wet etching.

According to the third embodiment, there is substantially not reduction in the film thickness of the conductive layer CL due to overetch even though the damage region DR is removed by less controllable wet etching. This makes it possible to suppress variation in the thickness of a channel layer (the conductive layer CL in the third embodiment) of TFT. That is, it is possible to suppress increase in variation in TFT characteristics and reduction in the yield of TFT. Further, the dry etch damage absorbing layer (the sacrifice layer SL in the invention) sandwiched between the source electrode SE and the drain electrode DE and the channel layer (the conductive layer CL) is not a high-resistance semiconductor such as Cu—In—Ga—Zn—O. Therefore, reduction in the on current of TFT can be suppressed.

Fourth Embodiment

FIGS. 4A to 4D illustrate the configuration of and a manufacturing method for a semiconductor device in the fourth embodiment. The fourth embodiment is different from the third embodiment in that the semiconductor layer SCL is comprised of three layers and it is identical with the third embodiment iri the other respects. In the third embodiment, the etch rate of the conductive layer CL is made lower than that of the sacrifice layer SL. As a result, when the sacrifice layer SL is removed by wet etching, wet etching is automatically stopped at the surface of the conductive layer CL. In the fourth embodiment, meanwhile, this etch stop function is assigned to an etch stopper layer ESL formed between the conductive layer CL and the sacrifice layer SL. That is, wet etching is automatically stopped at the surface of the etch stopper layer ESL.

Figure 4A:
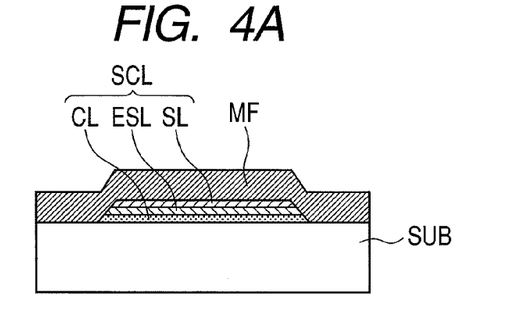
FIG. 4A is a sectional view illustrating the configuration of and a manufacturing method for a semiconductor device in a fourth embodiment of the invention.
Figure 4B:
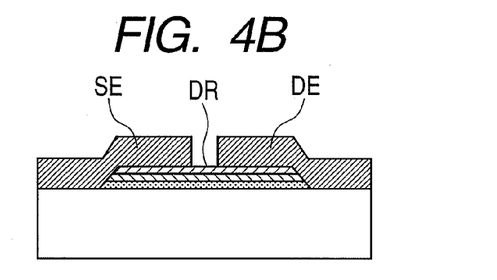
FIG. 4B is a sectional view following FIG. 4A.
Figure 4C:
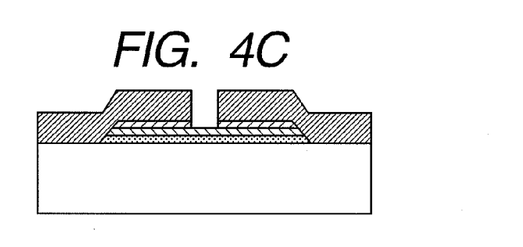
FIG. 4C is a sectional view following FIG. 4B.

The conductive layer CL, etch stopper layer ESL, and sacrifice layer SL are formed of oxide of Zn, In, Ga, or Sn, such as Zn—O, In—O, Ga—O, Sn—O, In—Ga—Zn—O, Zn—Sn—O, In—Sn—O, In—Zn—O, Ga—Zn—O, In—Ga—O, or Al—Zn—O, or composite oxide of them. These films are formed by sputtering, PLD, CVD, a method of application, a print process, or the like. It is desirable that the thickness of the conductive layer CL and the etch stopper layer ESL should be 5 nm or above and the thickness of the sacrifice layer SL should be 30 nm or above. Processing for forming an island structure for element isolation in the conductive layer CL, etch stopper layer ESL, and sacrifice layer SL is carried out by a combination of a common photolithography technology and wet etching or dry etching. The etch stopper layer ESL is lower than the sacrifice layer SL in etch rate to wet etching liquid comprised of inorganic acid or organic acid. To produce a difference in etch rate, for example, the following methods are used: the Sn concentration in the etch stopper layer ESL is made higher than that in the sacrifice layer SL; or the denseness (and thus the refraction index) of the etch stopper layer ESL is made higher than that of the sacrifice layer SL.

Various combinations of the above-mentioned materials are possible as a combination of the etch stopper layer ESL and the sacrifice layer SL. Among them, for example, the following combination is desirable: a combination of the etch stopper layer ESL comprised of either of Zn—Sn—O and In—Sn—O and the sacrifice layer SL comprised of any of In—Ga—Zn—O, Zn—O, In—Zn—O, Al—Zn—O, Ga—Zn—O, and Zn—Sn—O.

To make the Sn concentration in the etch stopper layer ESL higher than that in the sacrifice layer SL, the following method is used: the Sn concentration in raw material used when the etch stopper layer ESL is formed is made higher than that in raw material used when the sacrifice layer SL is formed. When both these layers are formed by sputtering or PLD, for example, the Sn concentration in a target for the etch stopper layer ESL is made higher than that in a target for the sacrifice layer SL. Or, Sn targets are simultaneously placed only when the etch stopper layer ESL is formed. To make the denseness of the etch stopper layer ESL higher than that of the sacrifice layer SL, for example, the film formation rate of the etch stopper layer ESL is made lower than that of the sacrifice layer SL. Or, the film formation temperature of the etch stopper layer ESL is made lower than that of the sacrifice layer SL.

Figure 4D:
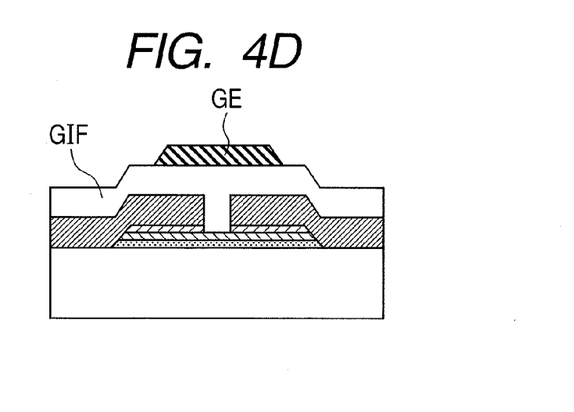
FIG. 4D is a sectional view following FIG. 4C.

According to the fourth embodiment, similarly with the first embodiment, there is substantially not reduction in the film thickness of the etch stopper layer ESL due to overetch even though the damage region DR is removed by less controllable wet etching. This makes it possible to suppress variation in the thickness of the channel layer (the conductive layer CL+the etch stopper layer ESL in the fourth embodiment) of TFT. That is, it is possible to suppress increase in variation in TFT characteristics and reduction in the yield of TFT. Further, the dry etch damage absorbing layer (the sacrifice layer SL in the invention) is sandwiched between the source electrode SE and the drain electrode DE and the channel layer (the conductive layer CL+the etch stopper layer ESL). This dry etch damage absorbing layer is not a high-resistance semiconductor such as Cu—In—Ga—Zn—O. Therefore, reduction in the on current of TFT can be suppressed. In addition, it is possible to determine a main part of conducting performance by the conductive layer CL and determine etch stop capability by the etch stopper layer ESL. This makes it possible to independently control the electrical conductivity and processability of a channel of TFT and increases the number of choices of materials used as compared with the third embodiment.

Fifth Embodiment

Figure 5:
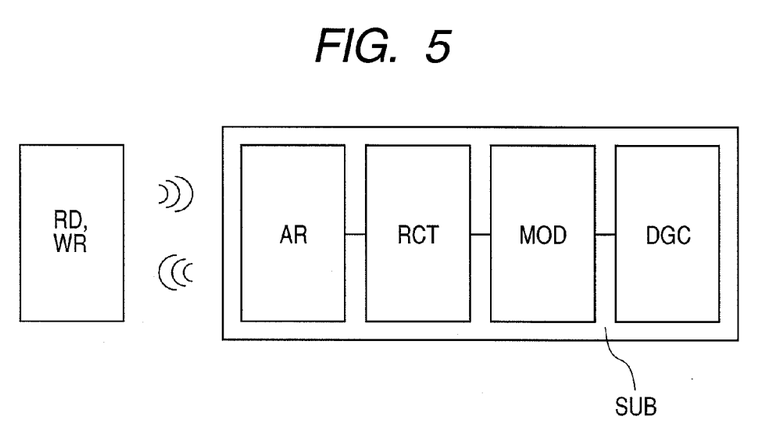
FIG. 5 is a block diagram illustrating the configuration of a semiconductor device (wireless IC tag) in a fifth embodiment of the invention.

FIG. 5 illustrates the configuration of a semiconductor device in the fifth embodiment. TFTs with the structure illustrated in any of the first to fourth embodiments are used to configure an antenna resonance circuit AR, a rectifier RCT, a modulator MOD, a digital circuit DGC, and the like to form a wireless IC tag. The wireless IC tag is capable of wirelessly communicating with a reader RD or a writer WR.

Sixth Embodiment

Figure 6:
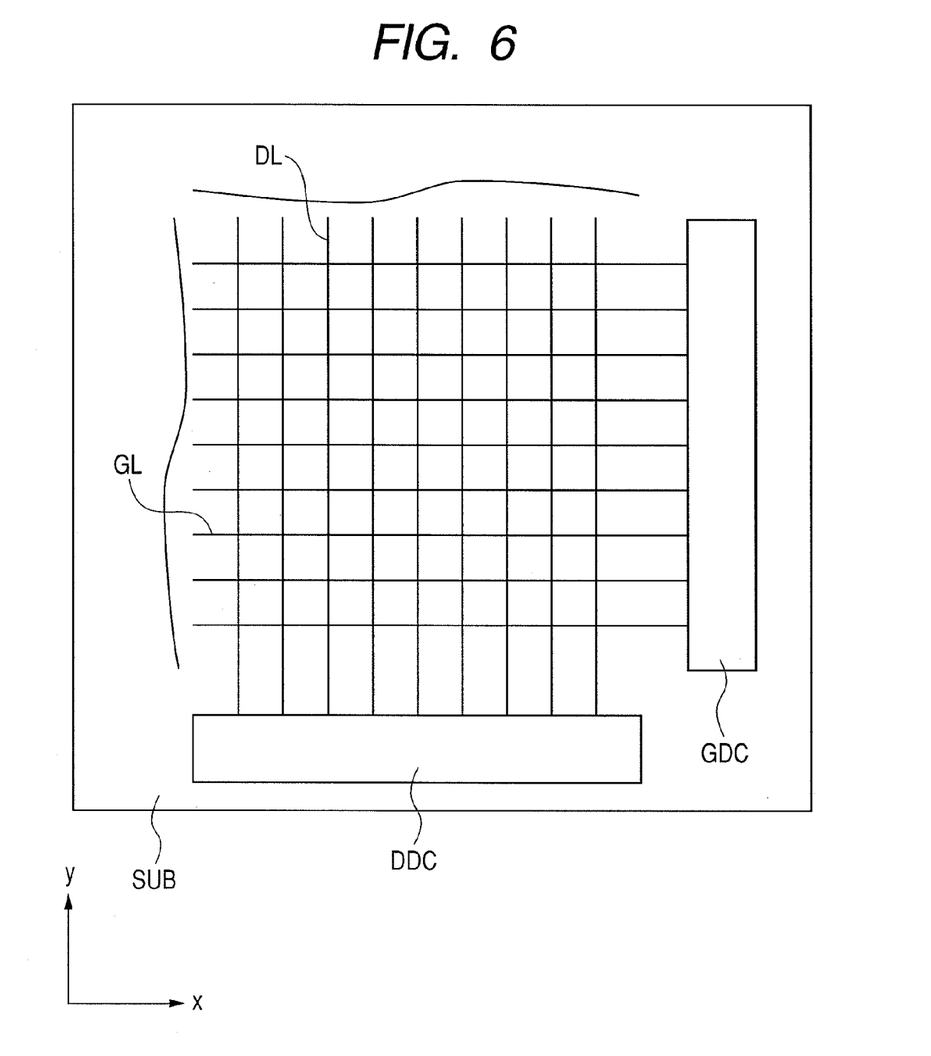
FIG. 6 is a schematic diagram illustrating the configuration of a semiconductor device in a sixth embodiment of the invention.

FIG. 6 illustrates the configuration of a semiconductor device in the sixth embodiment. In the sixth embodiment, elements having TFT with a structure in any of the first to fourth embodiments as a component are arranged over a substrate SUB in an array pattern. The TFT described in relation, to any of the first to fourth embodiments can be used as a transistor for switching or driving each element in the array, needless to add. In addition, it may also be used as a transistor comprising the following: a gate line drive circuit GDC that sends signals to a gate line GL connected to the gate electrode GE of the TFT; or a data line drive circuit DDC that sends signals to a data line DL connected to the source electrode SE or drain electrode DE of the TFT. In this case, the TFT in each element and TFT in the gate line drive circuit GDC or the data line drive circuit DDC can be concurrently formed.

Figure 7:
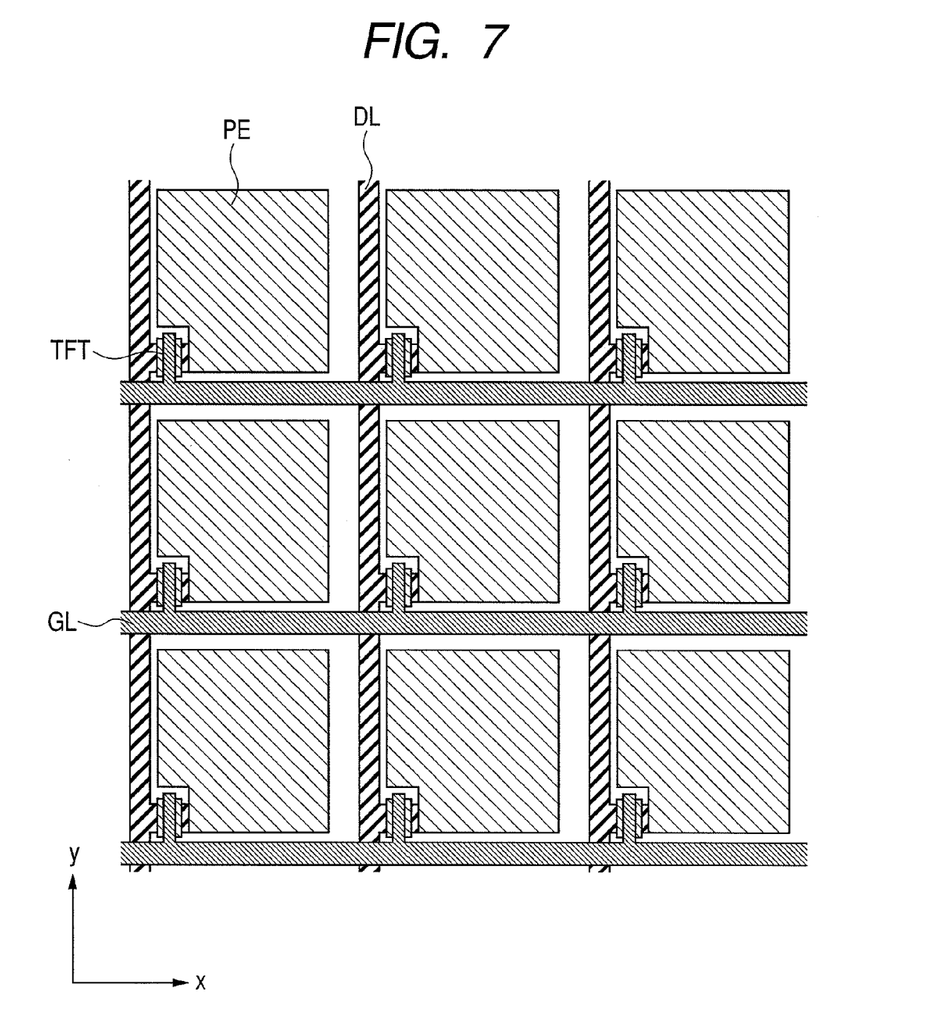
FIG. 7 is a schematic diagram illustrating configuration in which a semiconductor device in the sixth embodiment of the invention is applied to an active matrix liquid crystal display device.

When the above-mentioned array is applied to an active matrix liquid crystal display device, each element is configured as illustrated in FIG. 7, for example. When a scanning signal is supplied to a gate line GL extended in the x-direction in the drawing, TFT is turned on. Then an image signal is supplied from a data line DL extended in the y-direction in the drawing to a pixel electrode PE through this TFT that was turned on. The gate lines GL are arranged in parallel in the y-direction in the drawing and the data lines DL are arranged in parallel in the x-direction in the drawing. Each pixel electrode PE is placed in a region (pixel region) encircled by a pair of adjoining gate lines GL and a pair of adjoining drain lines DL. In this case, for example, each data line DL is electrically connected with each source electrode SE and each pixel electrode PE is electrically connected with each drain electrode DE. Alternatively, each data line DL may function also as a source electrode SE. The above-mentioned array need not be applied to a liquid crystal display device and may be applied to an organic EL display device or the like. In this case, the TFT is applied to each transistor comprising a pixel circuit. Further, the above-mentioned array may be applied to memory elements and the TFT may be applied to a selection transistor.

Up to this point, description has been given to the invention made by the present inventors based on embodiments. However, the invention is not limited to the above embodiments and can be variously modified without departing from the subject matter thereof.

A semiconductor device of the invention is applicable to a transistor, a peripheral circuit, or the like comprising a wireless IC tag, a memory element array, or the like. It is also applicable to a transistor, a peripheral circuit, or the like that drives each pixel of a transmissive, refractive, or semi-transmissive liquid crystal display device, an organic EL display device, or the like.

What is claimed is:

1. A manufacturing method for thin film transistors, comprising:
   forming a sacrifice layer comprised of a metal oxide semiconductor over a conductive layer comprised of a metal oxide semiconductor;
   forming a metal film over the sacrifice layer;
   processing the metal film by dry etching; and
   carrying out wet etching on the sacrifice layer exposed by the dry etching.

2. The manufacturing method according to claim 1, wherein an etching rate of the conductive layer is lower than an etching rate of the sacrifice layer.

3. The manufacturing method according to claim 1, wherein a concentration of Sn in the conductive layer is higher than a concentration of Sn in the sacrifice layer.

4. The manufacturing method according to claim 3, wherein the conductive layer is comprised of either of Zn—Sn—O or In—Sn—O, and wherein the sacrifice layer is comprised of any of In—Ga—Zn—O, Zn—O, In—Zn—O, Al—Zn—O, Ga—Zn—O, and Zn—Sn—O.

5. The manufacturing method according to claim 1, wherein a denseness of the conductive layer is higher than a denseness of the sacrifice layer.

6. A manufacturing method for thin film transistors, comprising:
forming an etch stopper layer comprised of a metal oxide semiconductor over a conductive layer comprised of a metal oxide semiconductor;
forming a sacrifice layer comprised of a metal oxide semiconductor over the etch stopper layer;
forming a metal film over the sacrifice layer;
processing the metal film by dry etching; and
carrying out wet etching on the sacrifice layer exposed by the dry etching.

7. The manufacturing method according to claim 6, wherein an etching rate of the etch stopper layer is lower than an etching rate of the sacrifice layer.

8. The manufacturing method according to claim 6, wherein a concentration of Sn in the etch stopper layer is higher than a concentration of Sn in the sacrifice layer.

9. The manufacturing method according to claim 8, wherein the etch stopper layer is comprised of either of Zn—Sn—O or In—Sn—O, and
wherein the sacrifice layer is comprised of any of In—Ga—Zn—O, Zn—O, In—Zn—O, Al—Zn—O, Ga—Zn—O, and Zn—Sn—O.

10. The manufacturing method according to claim 6, wherein a denseness of the etch stopper layer is higher than a denseness of the sacrifice layer.

11. A thin film transistor manufactured by:
forming a sacrifice layer comprised of a metal oxide semiconductor over a conductive layer comprised of a metal oxide semiconductor;
forming a metal film over the sacrifice layer;
processing the metal film by dry etching; and
carrying out wet etching on the sacrifice layer exposed by the dry etching.

12. The thin film transistor according to claim 11, wherein an etching rate of the conductive layer is lower than an etching rate of the sacrifice layer.

13. The thin film transistor according to claim 11, wherein a concentration of Sn in the conductive layer is higher than a concentration of Sn in the sacrifice layer.

14. The thin film transistor according to claim 13, wherein the conductive layer is comprised of either of Zn—Sn—O or In—Sn—O, and
wherein the sacrifice layer is comprised of any of In—Ga—Zn—O, Zn—O, In—Zn—O, Al—Zn—O, Ga—Zn—O, and Zn—Sn—O.

15. The thin film transistor according to claim 11, wherein a denseness of the conductive layer is higher than a denseness of the sacrifice layer.

* * * * *